(12) United States Patent
Lai et al.

(10) Patent No.: US 10,090,250 B1
(45) Date of Patent: Oct. 2, 2018

(54) MEMORY STRUCTURE AND METHOD FOR MANUFACTURING THE SAME

(71) Applicant: MACRONIX INTERNATIONAL CO., LTD., Hsinchu (TW)

(72) Inventors: Erh-Kun Lai, Taichung (TW); Hsiang-Lan Lung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/475,180

(22) Filed: Mar. 31, 2017

(51) Int. Cl.
| | |
|---|---|
| H01L 23/535 | (2006.01) |
| H01L 21/768 | (2006.01) |
| H01L 27/115 | (2017.01) |
| H01L 27/1157 | (2017.01) |
| H01L 27/11582 | (2017.01) |

(52) U.S. Cl.
CPC ...... *H01L 23/535* (2013.01); *H01L 21/76895* (2013.01); *H01L 27/1157* (2013.01); *H01L 27/11582* (2013.01)

(58) Field of Classification Search
None
See application file for complete search history.

(56) References Cited

U.S. PATENT DOCUMENTS

| | | |
|---|---|---|
| 9,401,371 B1 * | 7/2016 | Lee ................. H01L 27/11582 |
| 2003/0214022 A1 | 11/2003 | Yang et al. |
| 2015/0155297 A1 | 6/2015 | Eom et al. |
| 2015/0221666 A1 | 8/2015 | Lee |
| 2015/0372005 A1 | 12/2015 | Yon et al. |
| 2016/0005759 A1 | 1/2016 | Kim et al. |
| 2016/0204117 A1 * | 7/2016 | Liu ................. H01L 29/66825 257/324 |
| 2017/0200733 A1 * | 7/2017 | Lee ................. H01L 21/76816 |

* cited by examiner

*Primary Examiner* — Whitney T Moore
(74) *Attorney, Agent, or Firm* — McClure, Qualey & Rodack, LLP

(57) ABSTRACT

A memory structure includes a substrate, a plurality of stacks, a plurality of memory layers, a plurality of channel layers and a plurality of pad layers. The stacks are disposed on the substrate. The stacks are separated from each other by a plurality of first trenches. The stacks include alternately arranged first stacks and second stacks. Each of the stacks includes alternately stacked conductive strips and insulating strips. The memory layers are partially disposed in the first trenches. The memory layers extend onto the stacks in a conformal manner. The channel layers are disposed on the memory layers in a conformal manner. The pad layers are at least disposed on the channel layers at positions substantially above the first stacks.

13 Claims, 15 Drawing Sheets

MEMORY STRUCTURE AND METHOD FOR MANUFACTURING THE SAME

TECHNICAL FIELD

This disclosure relates to a semiconductor structure and a method for manufacturing the same. More particularly, this disclosure relates to a memory structure and a method for manufacturing the same.

BACKGROUND

For reasons of decreasing volume and weight, increasing power density, improving portability and the like, three-dimensional (3-D) semiconductor structures have been developed. In addition, elements and spaces in a semiconductor device have continuously been shrunk. This may cause some problems. For example, smaller landing areas for connectors may lead to contact difficulty and mismatch, and thereby the relative resistances are increased. As such, various improvements for the semiconductor structures and the methods for manufacturing them are still desired.

SUMMARY

This disclosure is directed to semiconductor structures and methods for manufacturing the same, and particularly to a memory structure and a method for manufacturing the same.

According to some embodiments, a memory structure comprises a substrate, a plurality of stacks, a plurality of memory layers, a plurality of channel layers and a plurality of pad layers. The stacks are disposed on the substrate. The stacks are separated from each other by a plurality of first trenches. The stacks comprise alternately arranged first stacks and second stacks. Each of the stacks comprises alternately stacked conductive strips and insulating strips. The memory layers are partially disposed in the first trenches. The memory layers extend onto the stacks in a conformal manner. The channel layers are disposed on the memory layers in a conformal manner. The pad layers are at least disposed on the channel layers at positions substantially above the first stacks.

According to some embodiments, a method of manufacturing a memory structure comprises the following steps. First, a preliminary structure is provided. The preliminary structure comprises a substrate, a plurality of stacks, an initial memory layer and an initial channel layer. The stacks are formed on the substrate and separated from each other by a plurality of first trenches. Each of the stacks comprises alternately stacked conductive strips and insulating strips. The initial memory layer is conformally formed on the stacks and the first trenches. The initial channel layer is conformally formed on the initial memory layer. Then, a sacrificial material is formed on the preliminary structure. The sacrificial material comprises portions above the stacks. A covering layer is formed on the sacrificial material. A plurality of second trenches are formed above the stacks. The second trenches penetrate through the covering layer and the sacrificial material. Thereafter, a plurality of pad layers are formed on the stacks by replacing the portions of the sacrificial material above the stacks with a pad material.

Figure 1A:
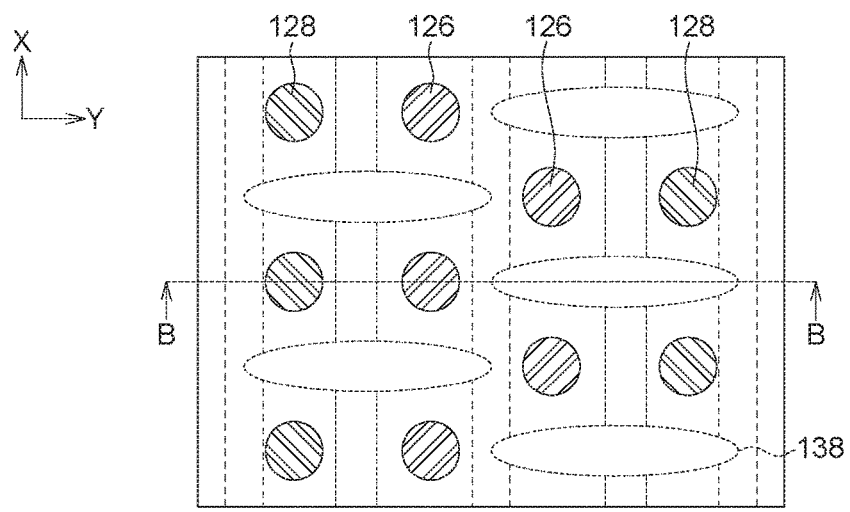
FIGS. 1A-1B illustrate a memory structure according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. The accompanying drawings are provided for illustrative purpose rather than limiting purpose. For clarity, some elements may be exaggerated or slightly shifted in some figures. In addition, some components and/or reference numerals may be omitted from the drawings. It is contemplated that elements and features of one embodiment can be beneficially incorporated in another embodiment without further recitation.

A memory structure according to embodiments comprises a substrate, a plurality of stacks, a plurality of memory layers, a plurality of channel layers and a plurality of pad layers. The stacks are disposed on the substrate. The stacks are separated from each other by a plurality of first trenches. The stacks comprise alternately arranged first stacks and second stacks. Each of the stacks comprises alternately stacked conductive strips and insulating strips. The memory layers are partially disposed in the first trenches. The memory layers extend onto the stacks in a conformal manner. The channel layers are disposed on the memory layers in a conformal manner. The pad layers are at least disposed on the channel layers at positions substantially above the first stacks.

Figure 1B:
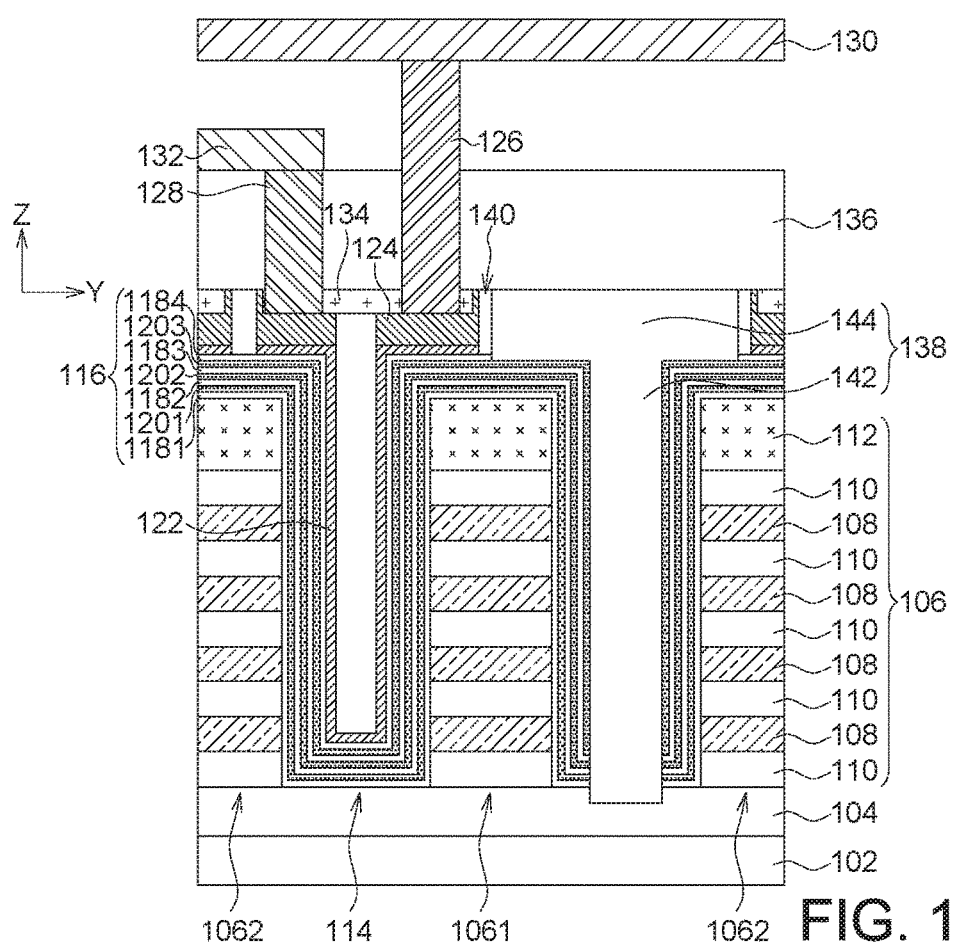

Referring to FIGS. 1A-1B, such a memory structure is shown. In the accompanying drawings, for ease of understanding, the memory structure is illustrated as a 3-D vertical channel NAND memory structure.

The memory structure comprises a substrate 102. In some embodiments, the substrate 102 may comprise structures, components and the like formed therein and/or thereon. For example, as shown in FIG. 1B, the substrate 102 may comprise a buried layer 104 disposed thereon.

The memory structure comprises a plurality of stacks 106 disposed on the substrate 102. The stacks 106 are separated from each other by a plurality of first trenches 114. The stacks 106 comprise alternately arranged first stacks 1061 and second stacks 1062. Each of the stacks 106 comprises alternately stacked conductive strips 108 and insulating strips 110. In some embodiments, as shown in FIG. 1B, each of the stacks 106 may further comprise an insulating layer 112 disposed above the conductive strips 108 and the insulating strips 110.

The memory structure comprises a plurality of memory layers 116. The memory layers 116 are partially disposed in the first trenches 114 and extend onto the stacks 106 in a conformal manner. In some embodiments, as shown in FIG. 1B, each of the memory layers 116 comprises alternately stacked oxide layers (1181-1184) and nitride layers (1201-1203). For example, ONONONO (oxide/nitride/oxide/nitride/oxide/nitride/oxide) multilayer structures are illustrated in FIG. 1B. In other words, each of the memory layers 116 comprises oxide layers 1181, 1182, 1183 and 1184 and nitride layers 1201, 1202 and 1203. These layers may have different thicknesses to provide blocking, trapping and tunneling functions, wherein the layers used as the tunneling structure (such as the oxide layer 1183, the nitride layer 1203 and the oxide layer 1184) are closer to the corresponding channel layer 122. In some other embodiments, SiON/SiN/oxide multilayer structures or other suitable structures may be used as the memory layers 116.

The memory structure comprises a plurality of channel layers 122 disposed on the memory layers 116 in a conformal manner. An insulating material may be filled into remaining spaces of the first trenches 114. The channel layers 122 may be separated from each other in a direction perpendicular to an extending direction of the stacks 106, such as the Y-direction in the drawings, by a plurality of second trenches 140 above the stacks 106. An insulating material may be filled into the second trenches 140. The channel layers 122 may be separated from each other in the extending direction of the stacks 106, such as the X-direction in the drawings, by a plurality of isolation structures 138. Here, the term "isolation" and the like embrace both aspects of physical isolation and electrical isolation. Each of the isolation structures 138 comprises a first portion 142 and a second portion 144 on the first portion 142, and a cross-sectional area of the second portion 144 is larger than a cross-sectional area of the first portion 142. In some embodiments, as shown in FIG. 1A, the channel layers 122 at two sides of one stack 106 are offset in the extending direction of the stacks 106 (X-direction) by a distance. For example, the channel layers 122 may be disposed in a "honey-comb" arrangement.

According to the embodiments, the memory structure comprises a plurality of pad layers 124 at least disposed on the channel layers 122 at positions substantially above the first stacks 1061. In some embodiments, as shown in FIG. 1B, the plurality of pad layers 124 further comprise pad layers 124 disposed on the channel layers 122 at positions substantially above the second stacks 1062. A thickness of the pad layers 124 may be larger than a thickness of the channel layers 122. For example, the thickness of the channel layers 122 may be in a range between 30 Å and 300 Å, and the thickness of the pad layers 124 may be in a range between 50 Å and 1000 Å. In addition, a conductivity of the pad layers 124 may be higher than a conductivity of the channel layers 122. For example, this may be achieved by a higher doping concentration. In some embodiments, the thickness of the pad layers 124 is larger than the thickness of the channel layers 122, and the conductivity of the pad layers 124 is higher than the conductivity of the channel layers 122.

The memory structure may further comprise a plurality of first connectors 126 and a plurality of second connectors 128. The first connectors 126 are substantially disposed above the first stacks 1061. The second connectors 128 are substantially disposed above the second stacks 1062. The memory structure may further comprise a plurality of first overlying conductive lines 130 and a plurality of second overlying conductive lines 132. The first connectors 126 couple the channel layers 122 to the first overlying conductive lines 130 by the pad layers 124. More specifically, the first connectors 126 contact the pad layers 124, and provide electrical connections to the channel layers 122 through the pad layers 124 disposed thereon. In some embodiments, corresponding to the channel layers 122, the first connectors 126 at two sides of one stack 106 are offset in the extending direction of the stacks 106 (X-direction) by a distance. The first connectors 126 penetrate through covering layers 134 on the pad layers 124 and one or more interlayer dielectric layers 136, and thereby couple the channel layers 122 to the first overlying conductive lines 130. The second connectors 128 couple the channel layers 122 to the second overlying conductive lines 132. Similarly, the second connectors 128 penetrate through the covering layers 134 and one or more interlayer dielectric layers 136, and couple the channel layers 122 to the second overlying conductive lines 132.

According to some embodiments, the first overlying conductive lines 130 extend in a direction different from an extending direction of the conductive strips 108 of the stacks 106 (such as the Y-direction), and the second overlying conductive lines 132 extend in the extending direction of the conductive strips 108 of the stacks 106 (the X-direction). According to some embodiments, the conductive strips 108 of the stacks 106 comprise word lines, the first overlying conductive lines 130 are bit lines, and the second overlying conductive lines 132 are common source lines. In some embodiments, the conductive strips 108 of the stacks 106 further comprise auxiliary gates (such as the bottom conductive strips 108), string select lines (such as the top conductive strips 108 of the first stacks 1061), ground select lines (such as the top conductive strips 108 of the second stacks 1062), and/or the like. A plurality of memory cells can be defined at cross-points of the channel layers 122 and the conductive strips 108 of the stacks 106 used as the word lines.

Now the description is directed to a method of manufacturing a memory structure according to embodiments. It comprises the following steps. First, a preliminary structure is provided. The preliminary structure comprises a substrate, a plurality of stacks, an initial memory layer and an initial channel layer. The stacks are formed on the substrate and separated from each other by a plurality of first trenches. Each of the stacks comprises alternately stacked conductive strips and insulating strips. The initial memory layer is conformally formed on the stacks and the first trenches. The initial channel layer is conformally formed on the initial memory layer. Then, a sacrificial material is formed on the preliminary structure. The sacrificial material comprises portions above the stacks. A covering layer is formed on the sacrificial material. A plurality of second trenches are formed above the stacks. The second trenches penetrate through the covering layer and the sacrificial material. Thereafter, a plurality of pad layers are formed on the stacks by replacing the portions of the sacrificial material above the stacks with a pad material.

Referring to FIGS. 2A-15B, such a method is illustrated. For ease of understanding, the method is illustrated to form the memory structure as shown in FIGS. 1A-1B. The figures identified by "B" are cross-sections taken along line B-B in the figures identified "A".

Figure 2A:
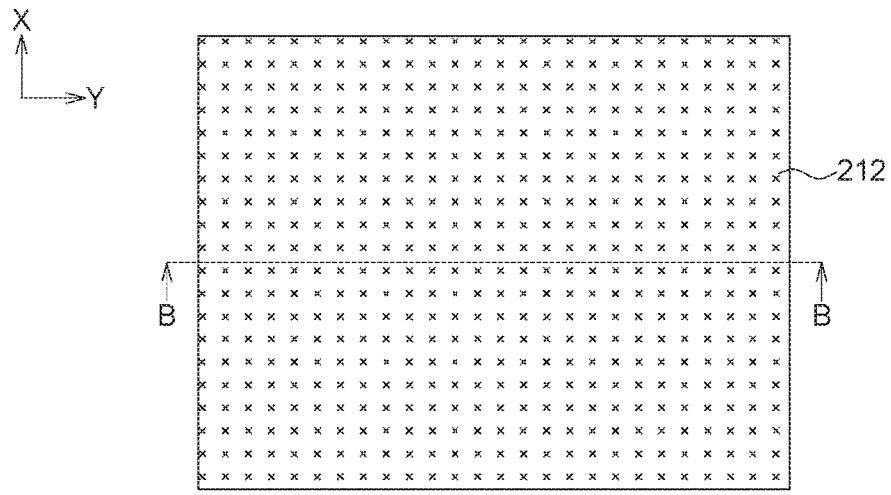
FIGS. 2A-15B illustrate a method of manufacturing a memory structure according to embodiments.
Figure 2B:
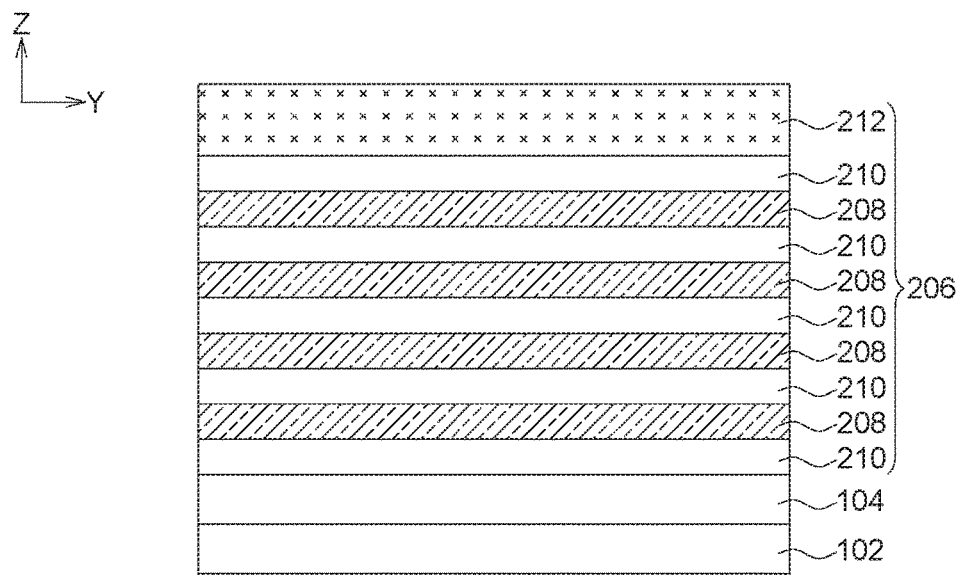

Referring to FIGS. 2A-2B, a substrate 102 is provided. The substrate 102 may comprise structures, components, and the like formed therein and/or thereon. For example, the substrate 102 may comprise a buried layer 104 disposed thereon. The buried layer 104 may be formed of oxide. An initial stack 206 for forming the stacks 106 is formed on the substrate 102. As shown in FIG. 2B, the initial stack 206 may be formed on the buried layer 104. The initial stack 206 comprises alternately stacked conductive layers 208 and insulating layers 210. The conductive layers 208 may be formed of doped-polysilicon, such as p-type polysilicon. The insulating layers 210 may be formed of oxide. The initial stack 206 may optionally comprise another insulating layer 212 above the conductive layers 208 and the insulating layers 210. The insulating layer 212 may be formed of silicon nitride (SiN). Such a SiN layer can compensate the film stress, and prevent the stack having a high aspect-ratio from collapse or bending.

Figure 3A:
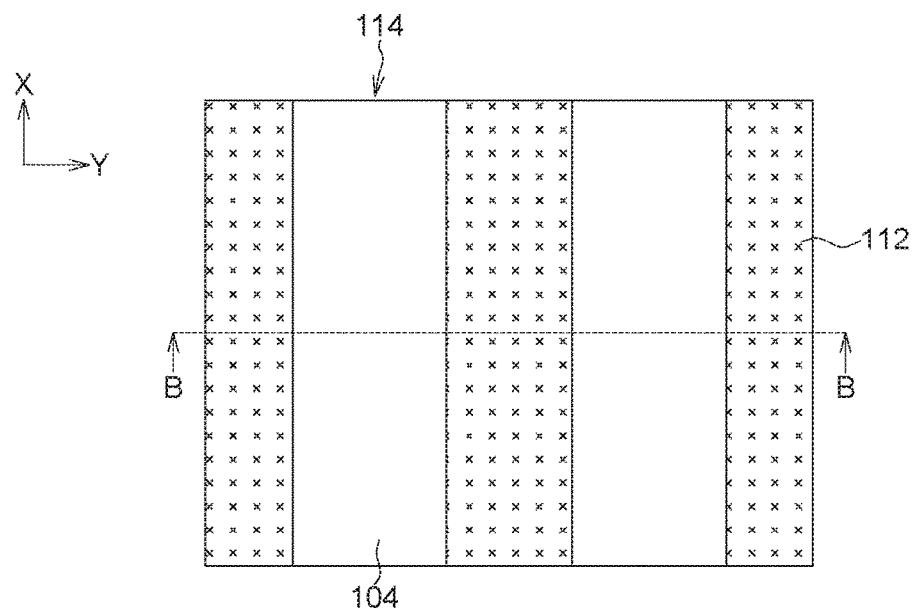
Figure 3B:
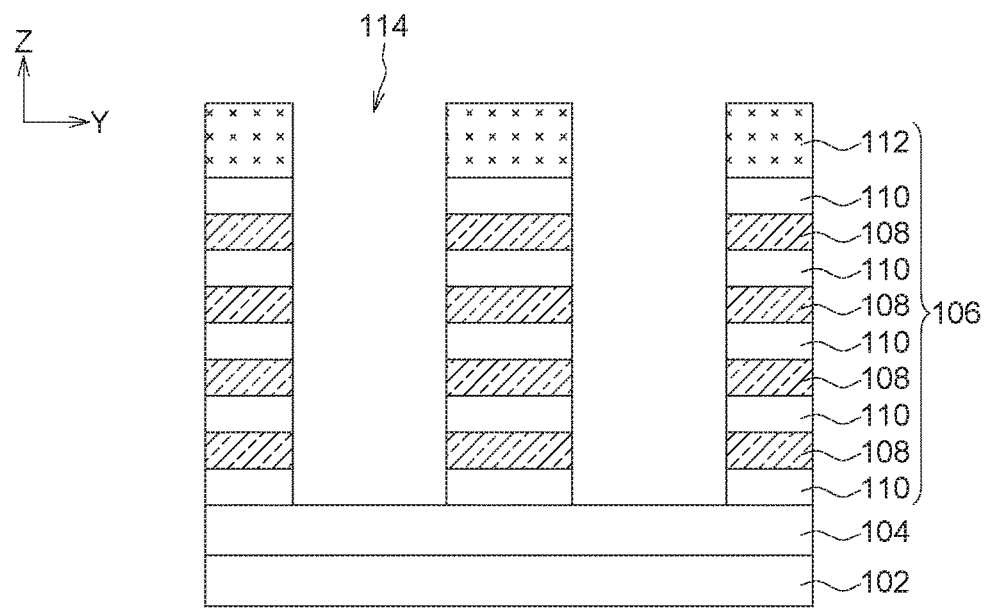

Referring to FIGS. 3A-3B, by separating the initial stack 206 using a patterning process, a plurality of stacks 106 are formed on the substrate 102 and separated from each other by a plurality of first trenches 114. The patterning process can be stopped at the buried layer 104. Each of the stacks 106 comprises alternately stacked conductive strips 108 and insulating strips 110. Each of the stacks 106 may further comprise an insulating layer 112 disposed above the conductive strips 108 and the insulating strips 110. As shown in FIGS. 1A-1B, the stacks 106 may comprise alternately arranged first stacks 1061 and second stacks 1062.

Figure 4A:
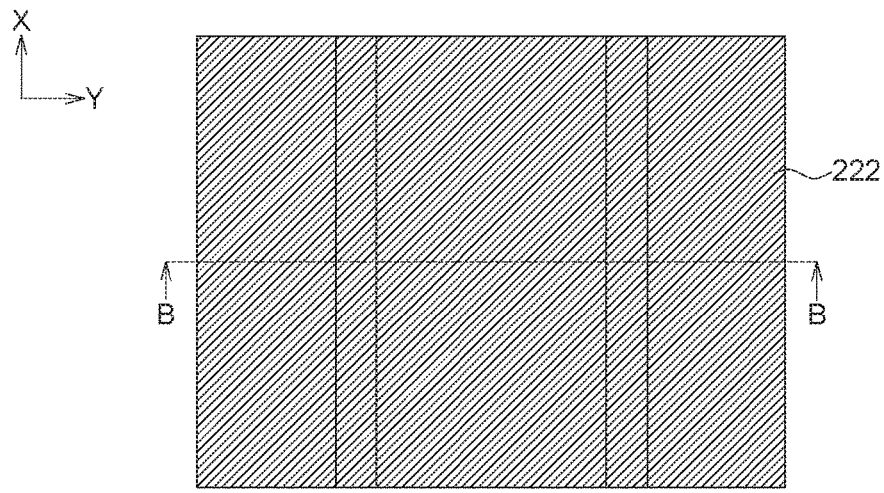
Figure 4B:
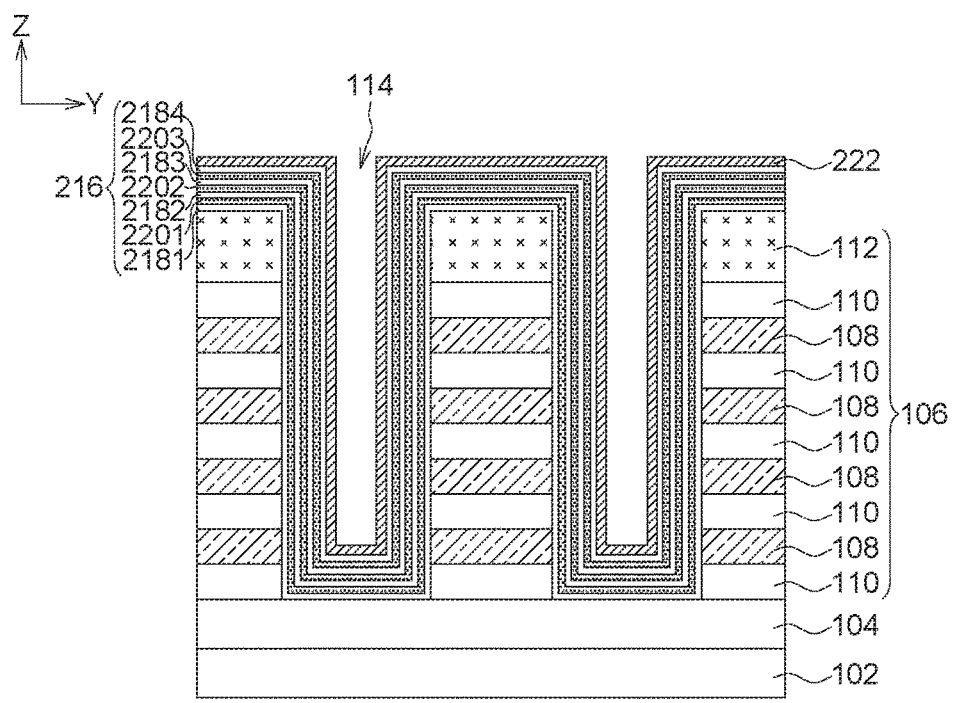

Referring to FIGS. 4A-4B, an initial memory layer 216 is conformally formed on the stacks 106 and the first trenches 114, and an initial channel layer 222 is conformally formed on the initial memory layer 216, such as by deposition processes. As such, said "preliminary structure" can be provided. The initial memory layer 216 may comprise alternately stacked oxide layers 2181-2184 (such as formed of silicon oxide) and nitride layers 2201-2203 (such as formed of silicon nitride). For example, an ONONONO multilayer structure is illustrated in FIG. 4B. In some other embodiments, a SiON/SiN/oxide multilayer structure or other suitable structures may be used as the initial memory layer 216. The initial channel layer 222 may be formed of undoped polysilicon, undoped SiGex, Ge or the like.

Figure 5A:
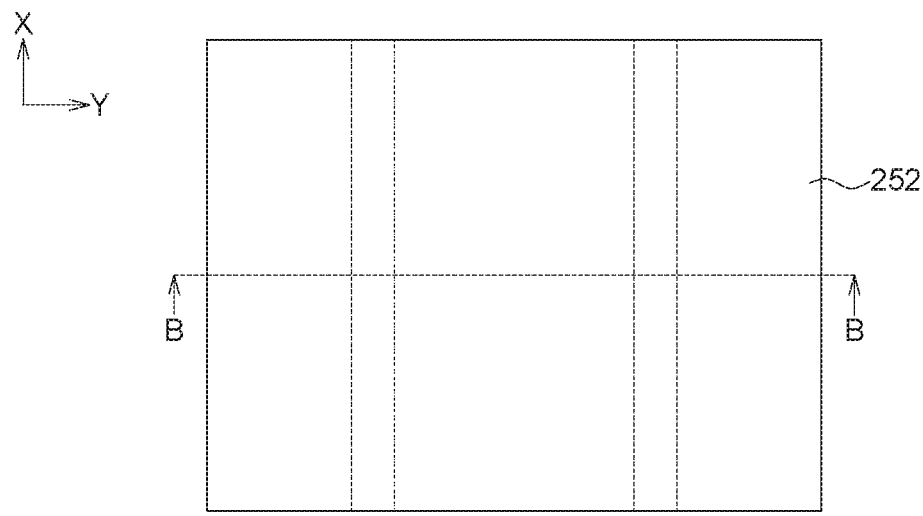
Figure 5B:
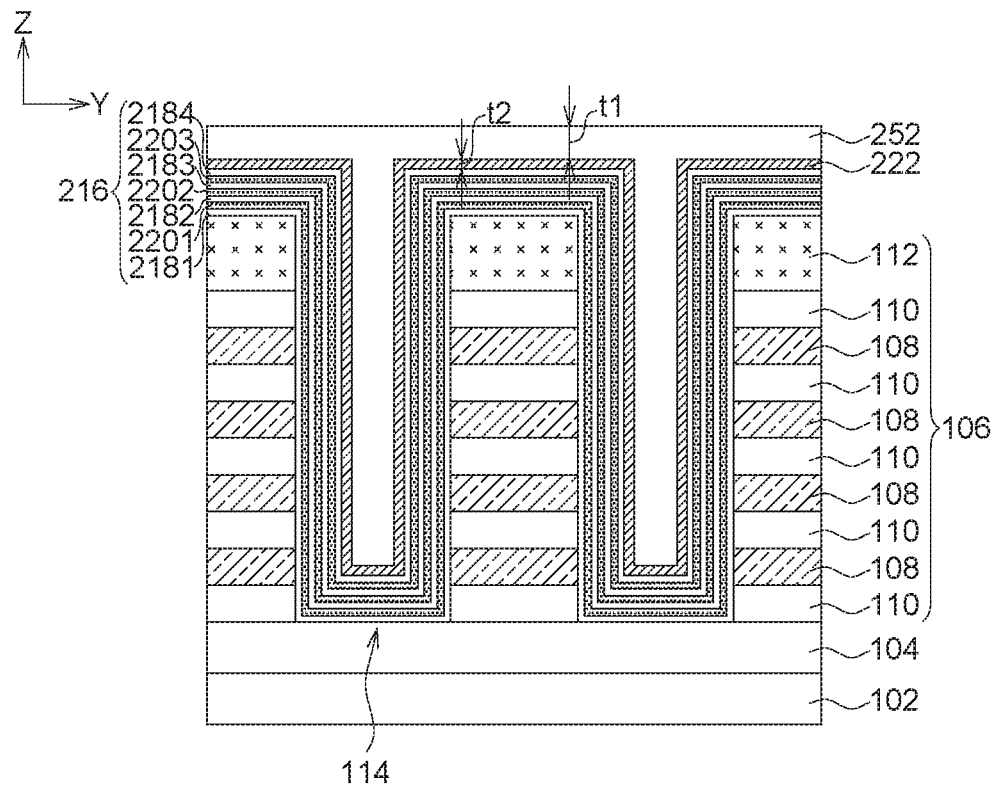

Referring to FIGS. 5A-5B, a sacrificial material 252 is formed on the preliminary structure, i.e., the structure shown in FIGS. 4A-4B. The sacrificial material 252 comprises portions above the stacks 106. A thickness t1 of the portions of the sacrificial material 252 above the stacks 106 may be larger than a thickness t2 of the initial channel layer 222. For example, the thickness t2 of the initial channel layer 222 may be in a range between 30 Å and 300 Å, while the thickness t1 of the portions of the sacrificial material 252 above the stacks 106 may be in a range between 50 Å and 1000 Å, such as about 500 Å. The sacrificial material 252 may be oxide. In such cases, since the sacrificial material 252 is an insulating material, it can be used as the insulating material filled into the first trenches 114. A planarization process, such as a chemical-mechanical planarization (CMP) process, may be carried out while needed.

Figure 6A:
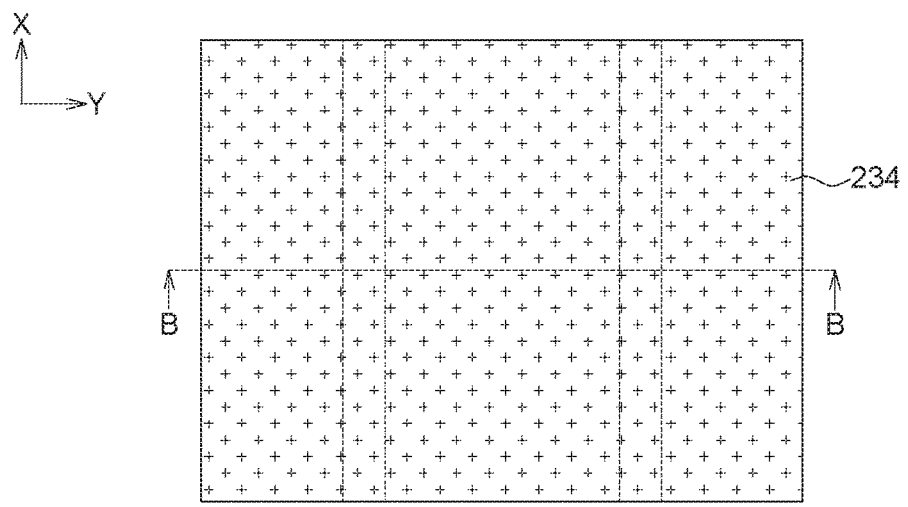
Figure 6B:
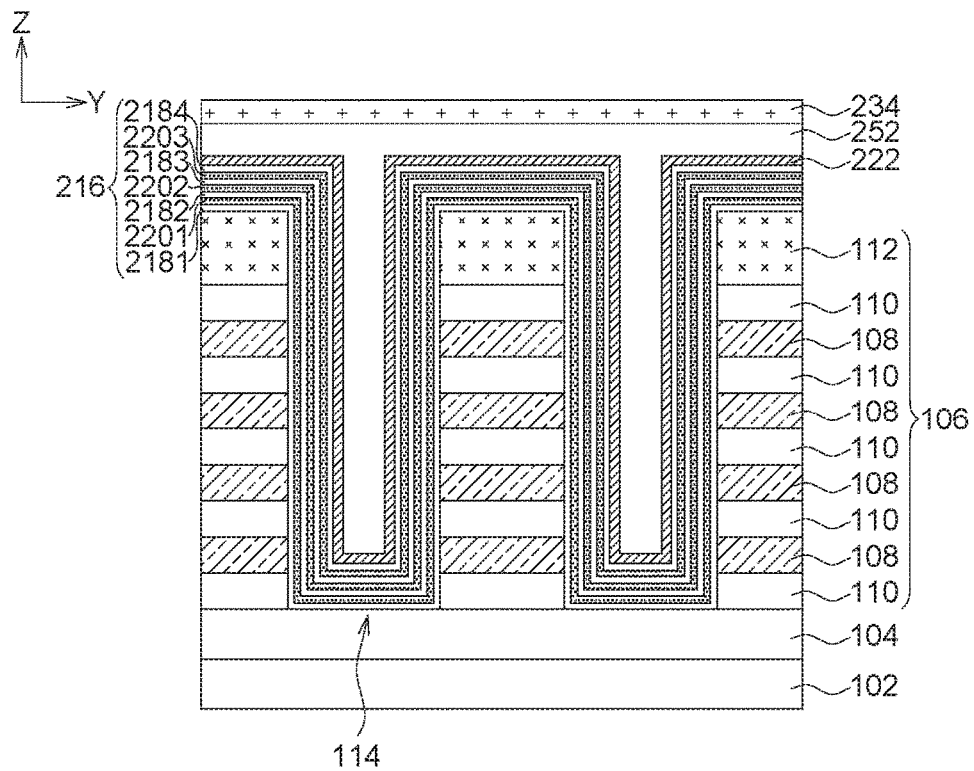

Referring to FIGS. 6A-6B, a covering layer 234 is formed on the sacrificial material 252, such as by a deposition process. The covering layer 234 is formed of a material different from the sacrificial material 252. For example, the covering layer 234 may be formed of silicon nitride (SiN).

Figure 7A:
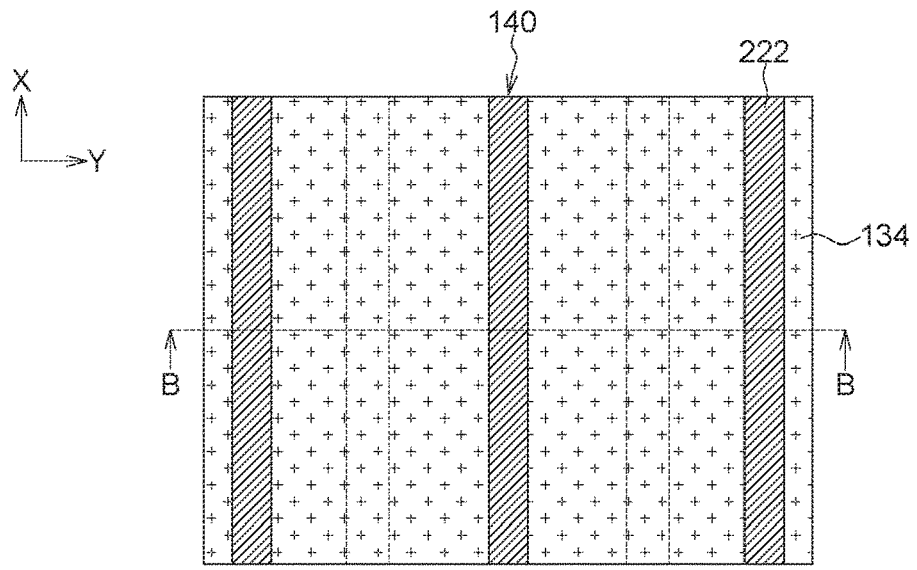
Figure 7B:
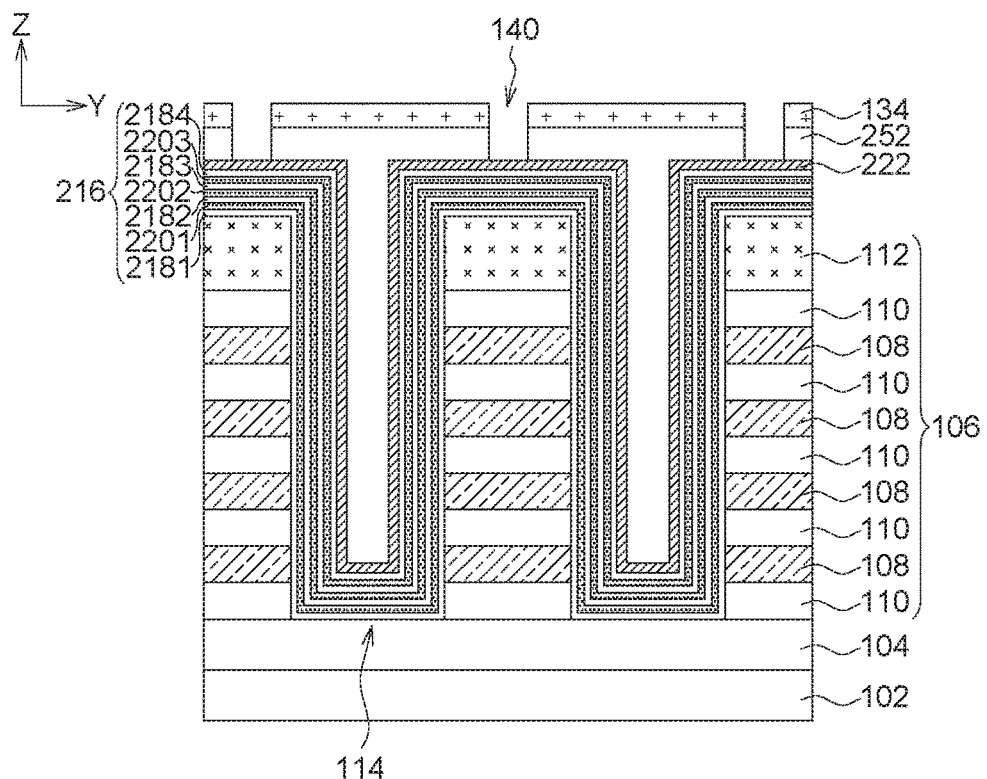

Referring to FIGS. 7A-7B, a plurality of second trenches 140 are formed above the stacks 106, such as by an etching process. The second trenches 140 penetrate through the covering layer 234 and the sacrificial material 252. In other words, the etching process is stopped on the initial channel layer 222. After the separation step, the covering layers 134 as shown in FIGS. 1A-1B are formed.

Figure 8A:
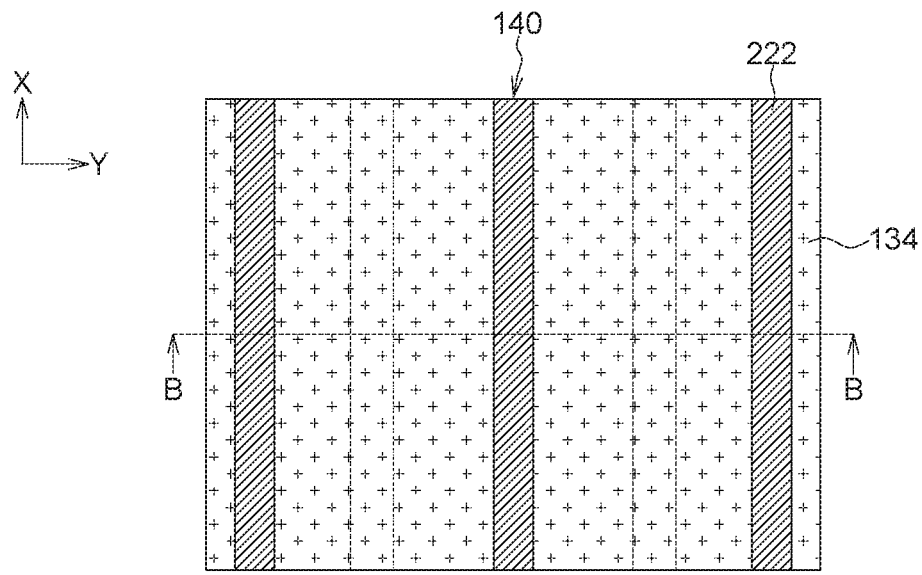
Figure 8B:
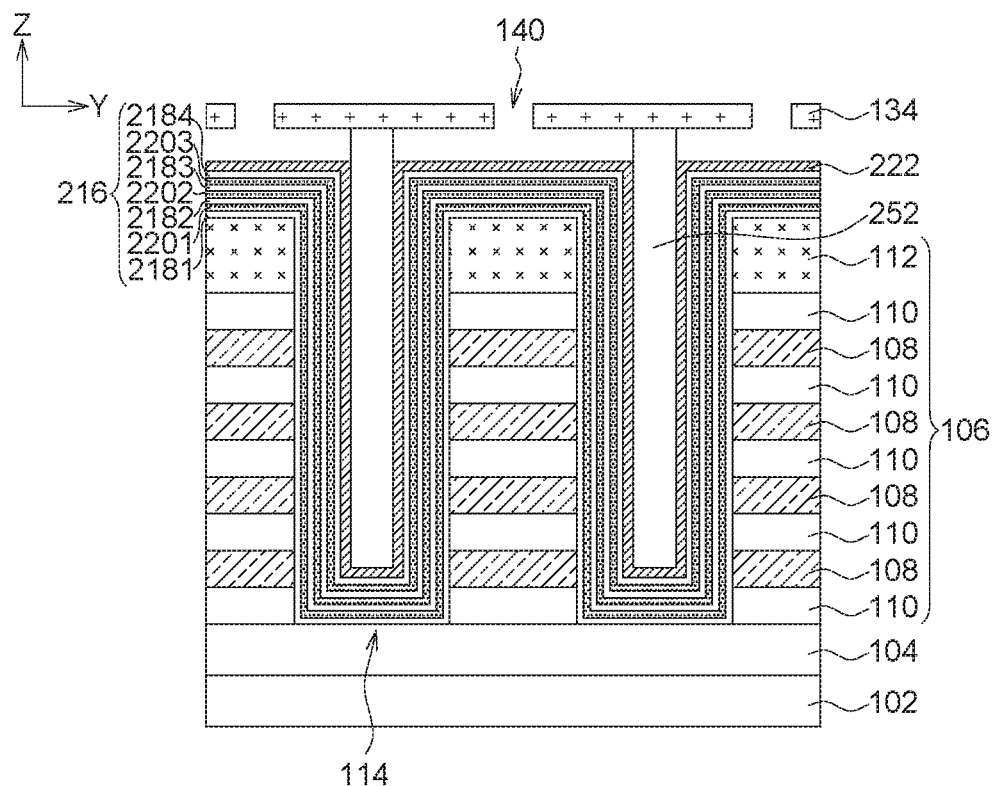

Referring to FIGS. 8A-8B, the portions of the sacrificial material 252 above the stacks 106 are removed, such as through the second trenches 140. This step can be controlled such that portions of the sacrificial material 252 that are filled into the first trenches 114 and used as the insulating material for the first trenches 114 and portions of the sacrificial material 252 thereon are remained.

Figure 9A:
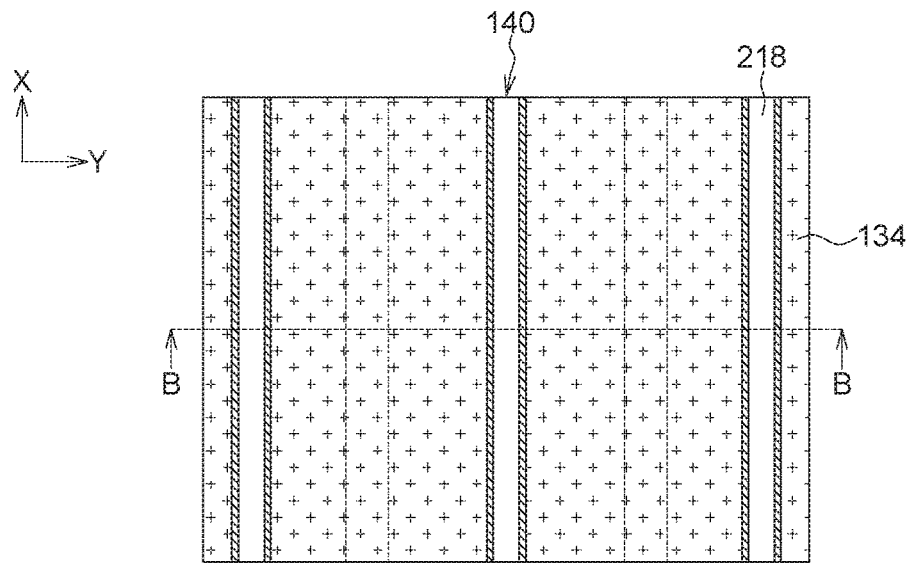
Figure 9B:
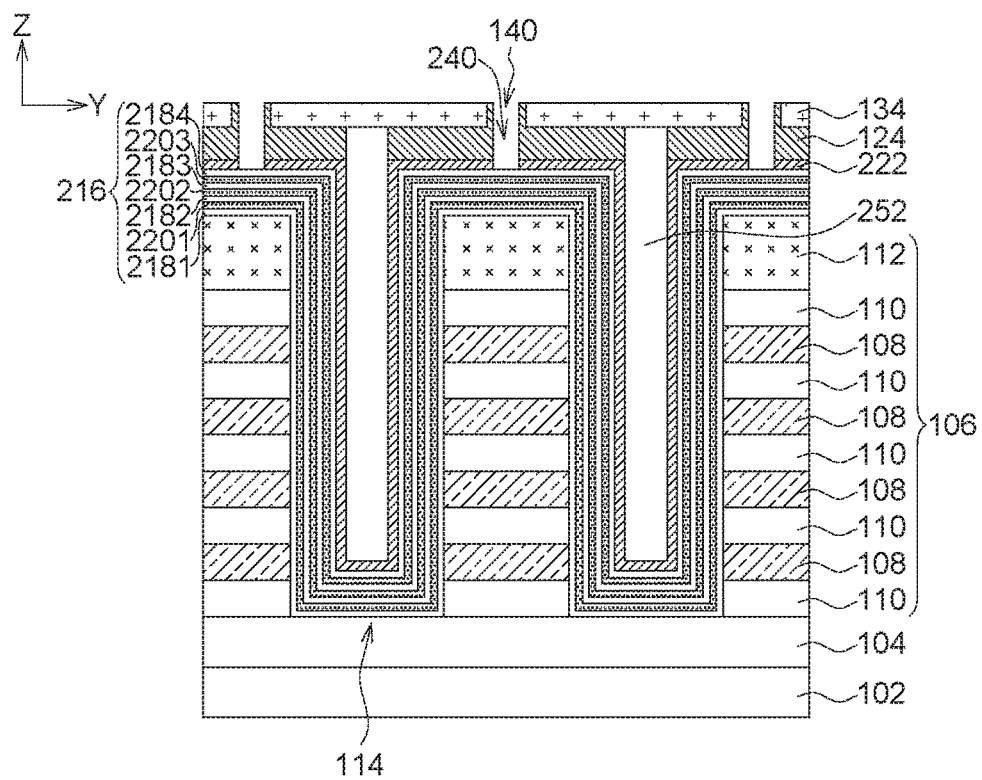

Referring to FIGS. 9A-9B, a pad material is filled into the second trenches 140 and spaces formed by the removal of the portions of the sacrificial material 252 above the stacks 106. The pad material may be heavily-doped polysilicon, such as n-type heavily-doped polysilicon, which has a higher conductivity than the material used for the initial channel layer 222. If the portions of the sacrificial material 252 above the stacks 106 is 500 Å thick, the pad material may be filled with a thickness in a range between 250 Å and 400 Å to ensure the spaces between the covering layers 134 and the initial channel layer 222 are sealed. Then, cutting lines 240 are formed in the second trenches 140, such as by an etching process. The cutting lines 240 separate the pad material and the initial channel layer 222 on the stacks 106. As such, a plurality of pad layers 124 are formed on the stacks 106 by replacing the portions of the sacrificial material 252 above the stacks 106 with the pad material. In addition, the cutting lines 240 extend the second trenches 140 in the depth direction (the Z-direction), and thereby the initial channel layer 222 are separated from each other in a direction perpendicular to the extending direction of the stacks 106 (such as the Y-direction). In some embodiments, as shown in FIGS. 9A-9B, the pad material may remain on sidewalls of the second trenches 140.

Figure 10A:
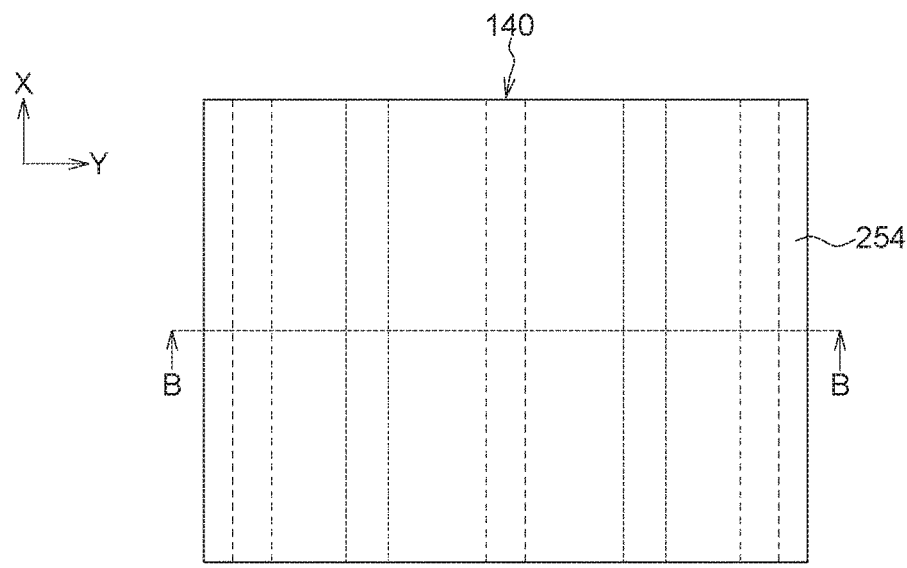
Figure 10B:
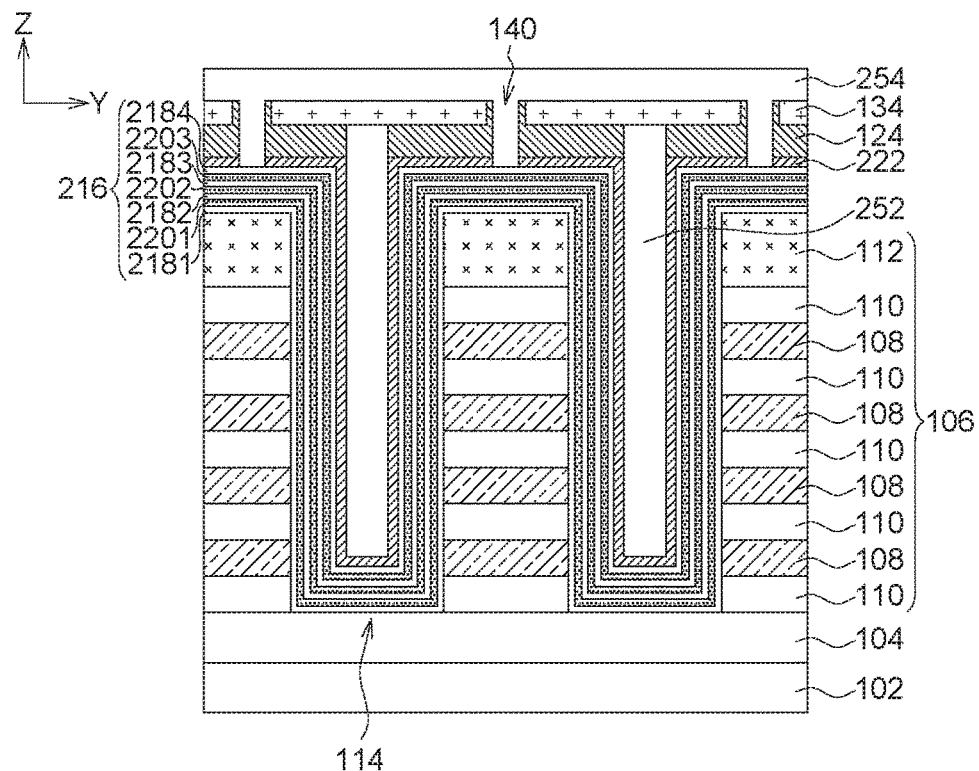

Referring to FIGS. 10A-10B, an insulating material 254 is filled into the second trenches 140, such as by a deposition process. A planarization process, such as a CMP process, may be carried out while needed. In some embodiments, as shown in FIGS. 10A-10B, the insulating material 254 forms a layer on the covering layers 134. In some other embodiments, the insulating material 254 does not form such a layer. That is, the insulating material 254 remains only in the second trenches 140. The insulating material 254 may be oxide.

Figure 11A:
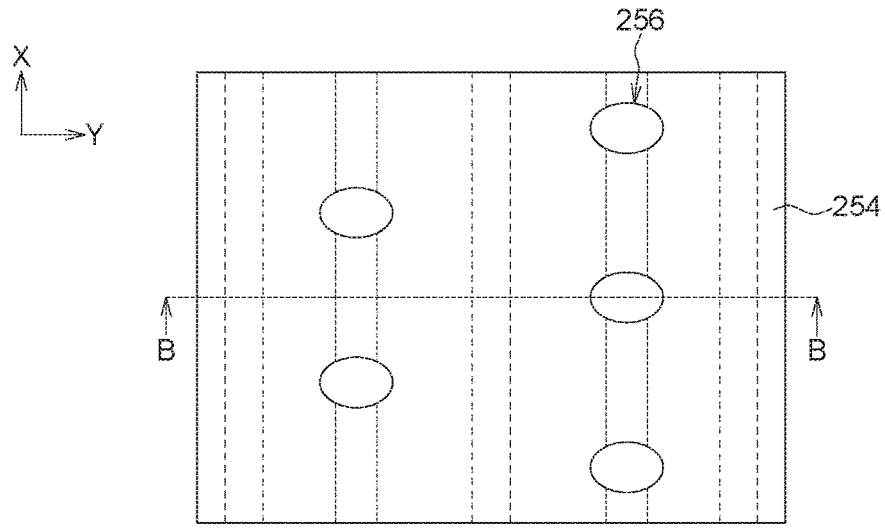
Figure 11B:
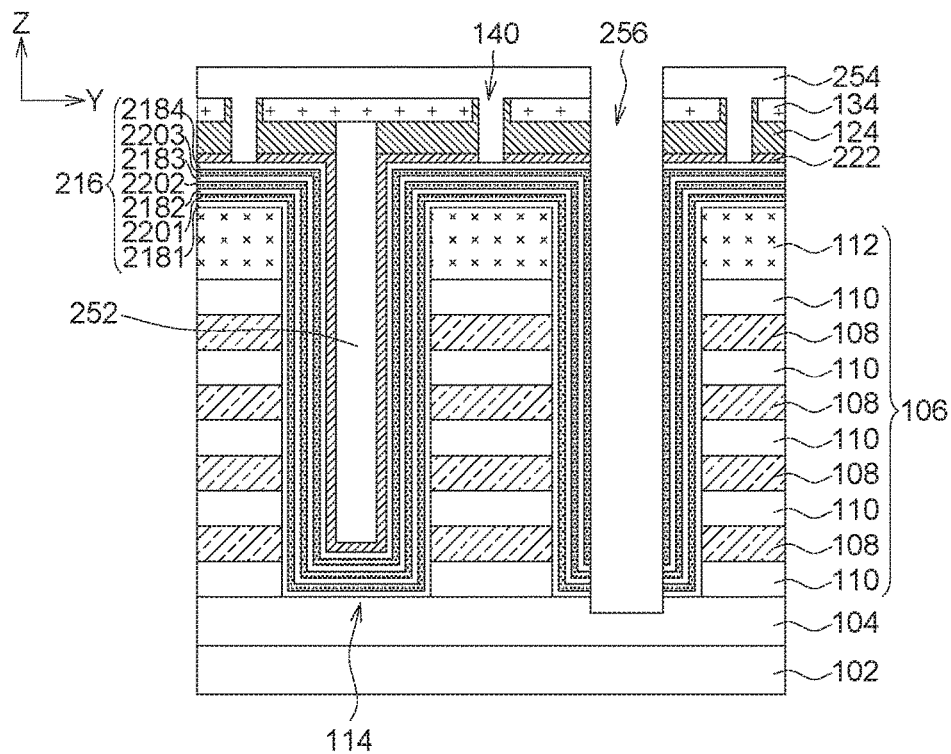

Referring to FIGS. 11A-11B, a plurality of first holes 256 are formed in the first trenches 114, such as by a non-selective etching process. More specifically, the first holes 256 penetrate through the insulating material 254 (if existing), the covering layers 134, the pad layers 124 and the materials in the first trenches 114 such as the insulating material, the initial channel layer 222 and some portions of the initial memory layer 216 therein. In some embodiments, due to the formation of the first holes 256, the portions of the initial memory layer 216 that are at corresponding positions may be completely removed, and even some portions of the stacks 106 may also be removed. In some embodiments, as shown in FIG. 11B, the first holes 256 extend into the underlying buried layer 104. In particular, portions of the initial channel layer 222 in the first trenches 114 are removed by the formation of the first holes 256. In some embodiments, as shown in FIGS. 11A-11B, the first holes 256 at two sides of one stack 106 are offset in the extending direction of the stacks 106 (the X-direction) by a distance. In some embodiments, an anisotropic etching process may then be carried out to prevent undesired remains of the initial channel layer 222 in the first holes 256. In some embodiments, before filling the first holes 256 with an isolation material (such as the first isolation material 258 shown in FIGS. 12A-12B), a liner layer (not shown) formed of SiN may be formed to prevent an edge electric-field enhancement.

Figure 12A:
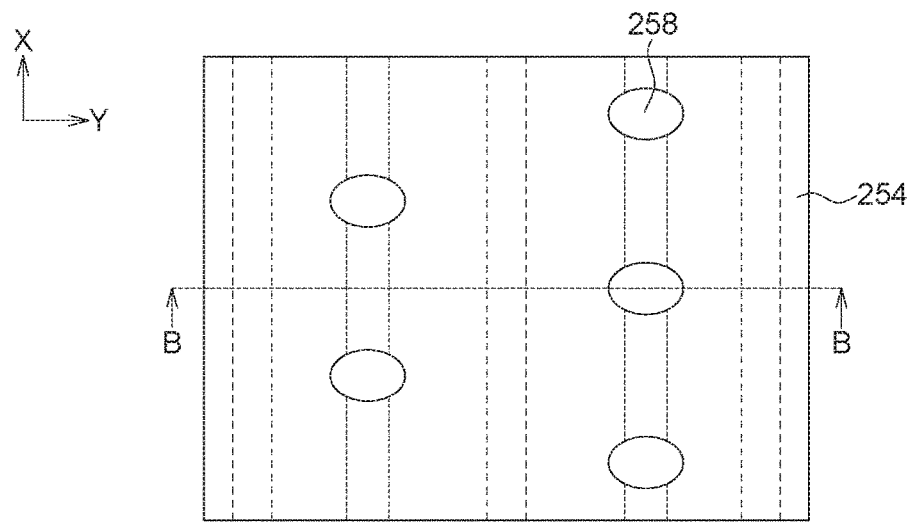
Figure 12B:
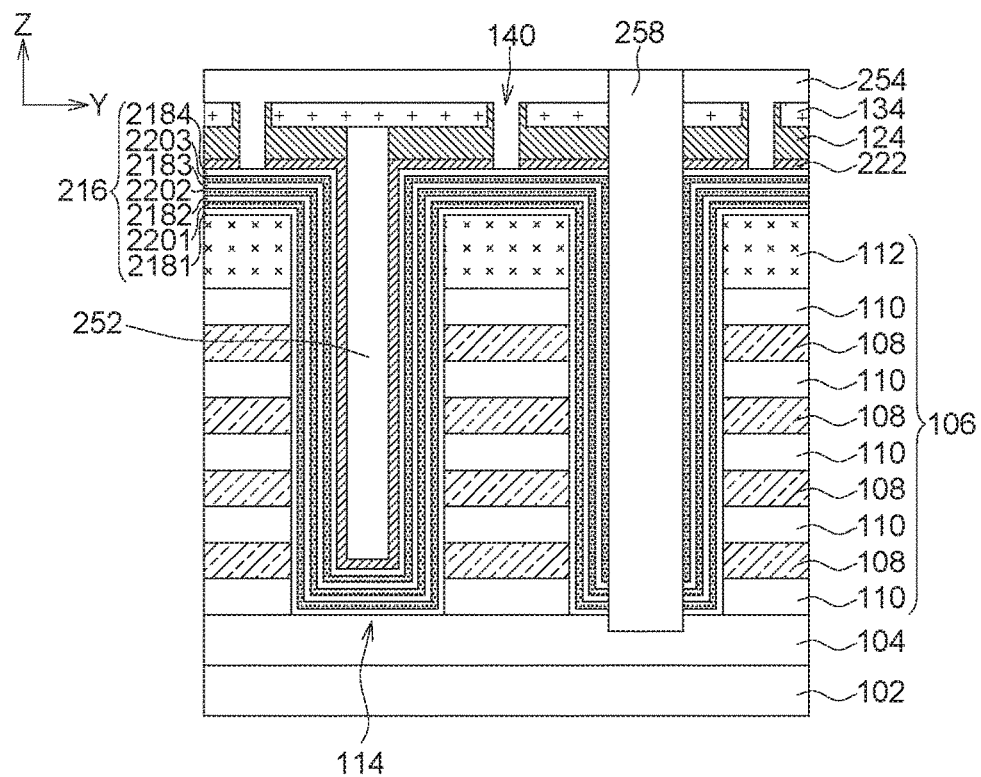

Referring to FIGS. 12A-12B, a first isolation material 258 is filled into the first holes 256, such as by a deposition process. The first isolation material 258 may be oxide. In some embodiments, air gaps (not shown) exist in the first isolation material 258. The air gaps are beneficial for decreasing the coupling rate of two adjacent channel layers (122). A planarization process, such as a CMP process, may be carried out while needed.

Figure 13A:
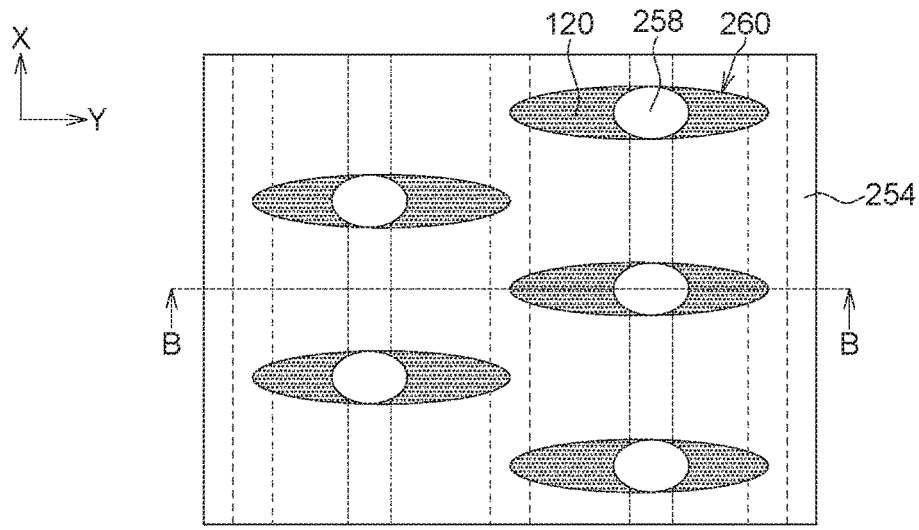
Figure 13B:
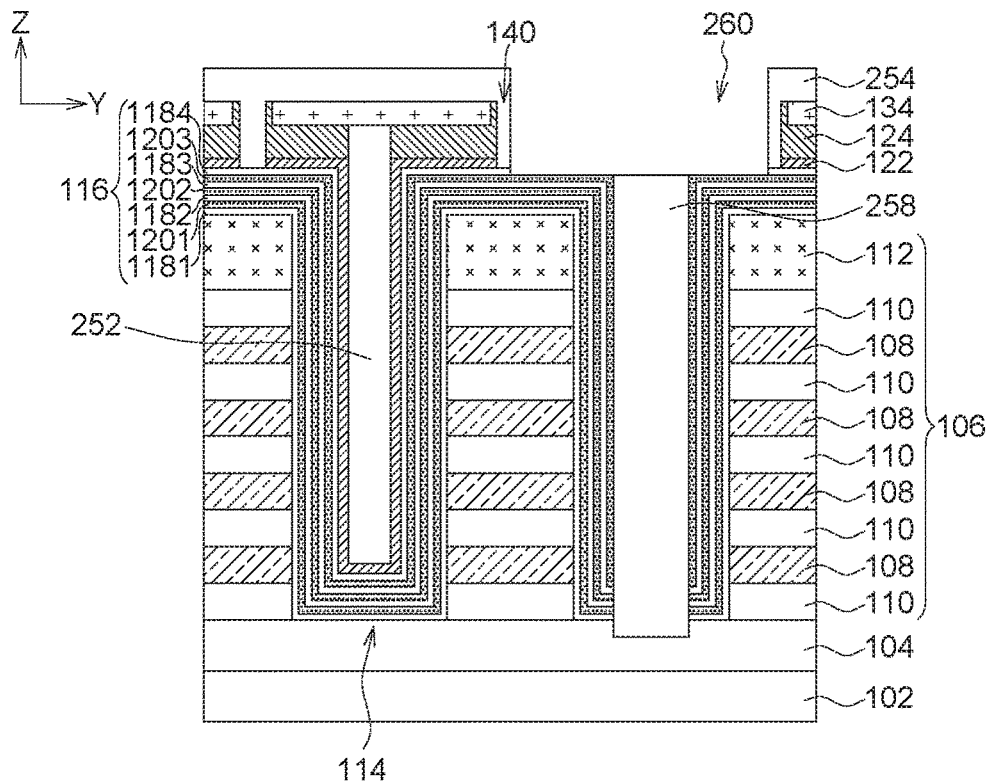

Referring to FIGS. 13A-13B, a plurality of second holes 260 are formed at positions of upper portions of the first holes 256, such as by an etching process. A cross-sectional area of the second holes 260 is larger than a cross-sectional area of the first holes 256. The etching process may be stopped on the nitride layer 220 of the initial memory layer 216 or the insulating layers 112 of the stacks 106. In particular, portions of the initial channel layer 222 on the stacks 106 are removed by the formation of the second holes 260. As such, the initial channel layer 222 are separated from each other in the extending direction of the stacks 106 (the X-direction), and thereby the channel layers 122 as shown in FIGS. 1A-1B are formed. In addition, the memory layers 116 as shown in FIGS. 1A-1B are formed. In some embodiments, the first holes 256 and the second holes 260 have elliptical cross sections (comprising circular cross sections), and the elliptical cross sections of the first holes 256 and the second holes 260 may be co-centered. In this step, since only the hole-type openings are formed, it is much easier to carry out compared with the case in which hole-type and trench-type openings are formed by the same process. In addition, a larger process window can be obtained.

Figure 14A:
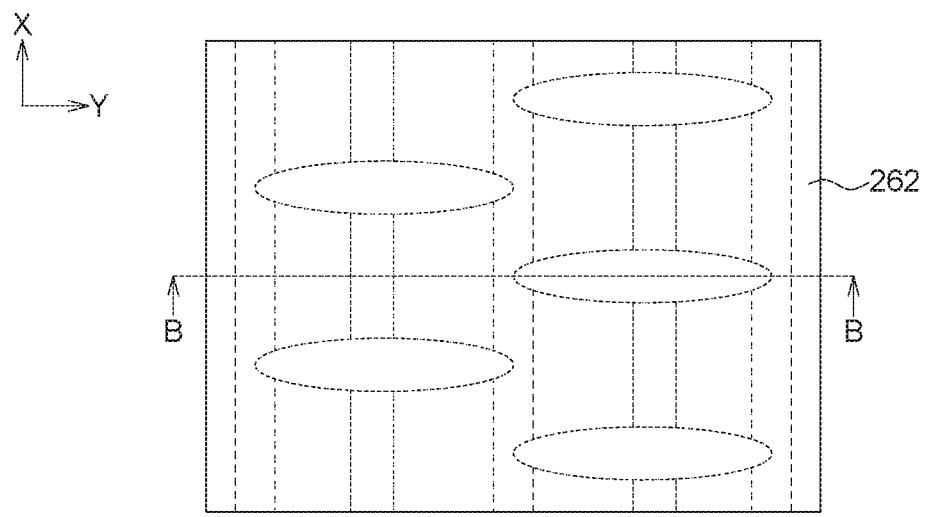
Figure 14B:
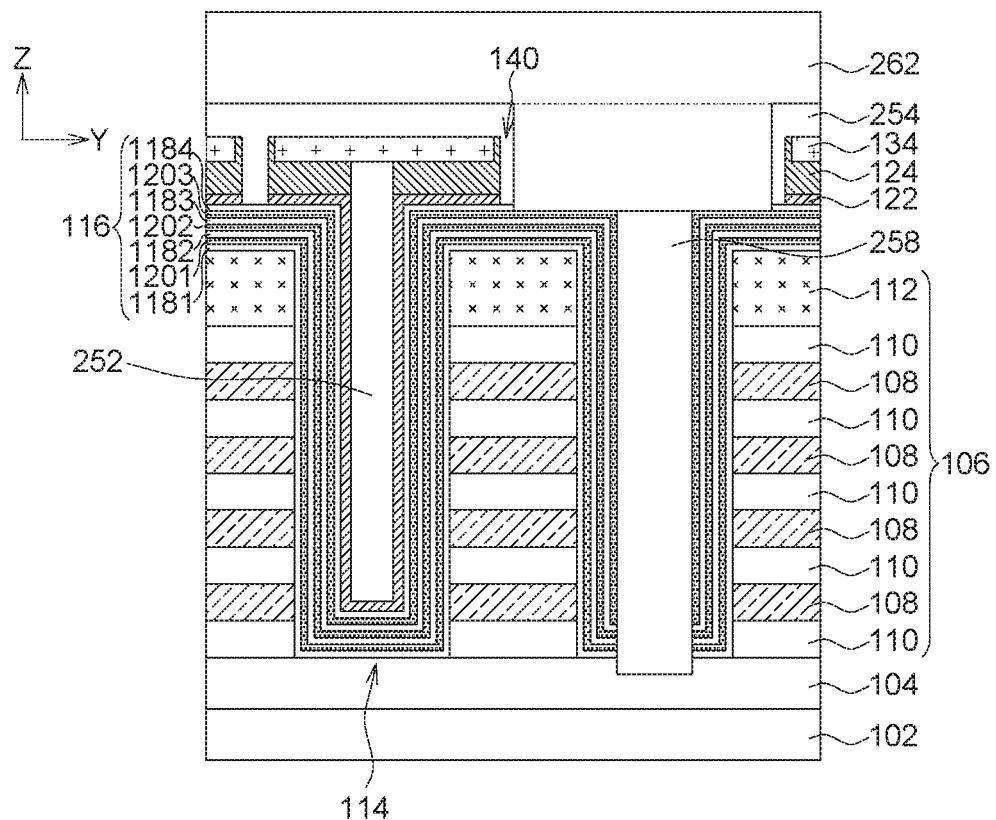

Referring to FIGS. 14A-14B, a second isolation material 262 is filled into the second holes 260. The second isolation material 262 may be the same as the first isolation material 258, such as oxide. The first isolation material 258 in the first holes 256 and the second isolation material 262 in the second holes 260 constitute the isolation structures 138 shown in FIGS. 1A-1B, wherein the first isolation material 258 in the first holes 256 forms the first portion 142, and the second isolation material 262 in the second holes 260 forms the second portion 144. The second isolation material 262 may also be used to form an interlayer dielectric layer 136 as shown in FIGS. 1A-1B. A planarization process, such as a CMP process, may be carried out while needed.

Figure 15A:
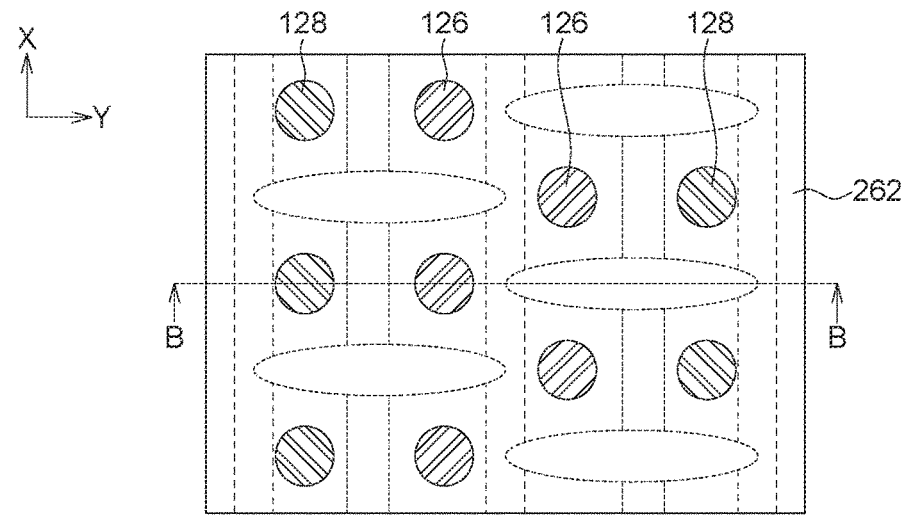
Figure 15B:
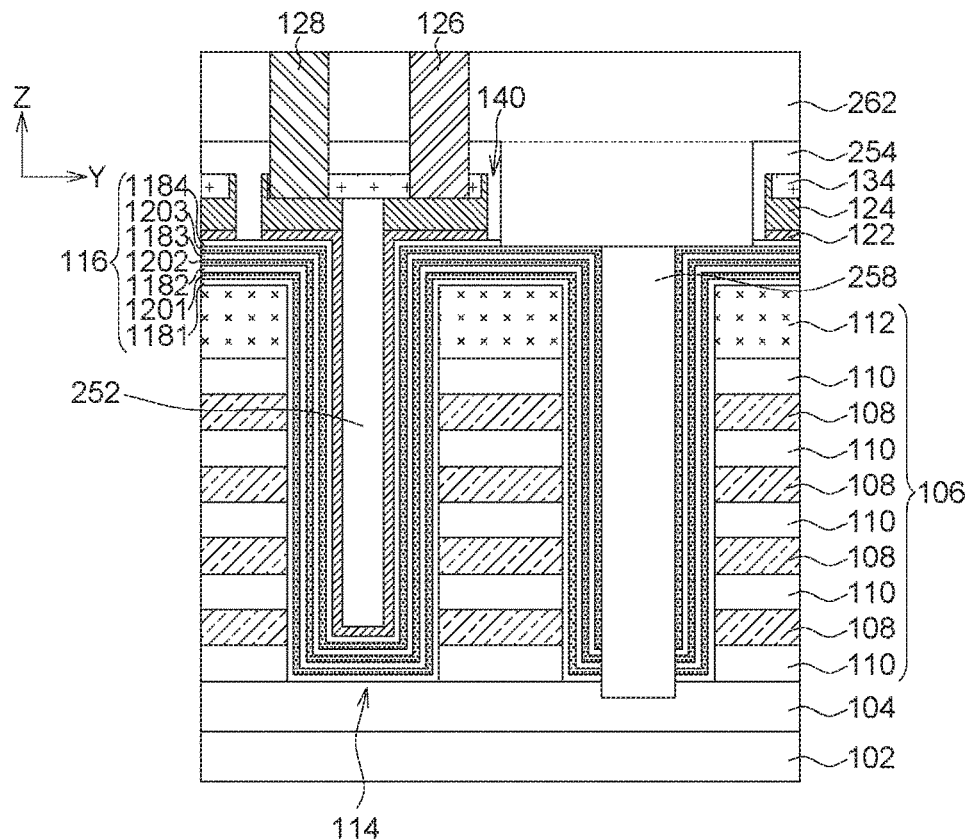

Referring to FIGS. 15A-15B, a plurality of first connectors 126 are formed at positions substantially above the first stacks (1061 in FIG. 1B), and a plurality of second connectors 128 are formed at positions substantially above the second stacks (1062 in FIG. 1B). The first connectors 126 and the second connectors 128 may be formed with the bottom surfaces directly on the pad layers 124. The first connectors 126 are configured for coupling the channel layers 122 to a plurality of first overlying conductive lines (130 in FIG. 1B) by the pad layers 124. The second connectors 128 are configured for coupling the channel layers 122 to a plurality of second overlying conductive lines (132 in FIG. 1B).

Thereafter, other processes typically used for manufacturing a memory structure, such as forming first overlying conductive lines (130 in FIG. 1B) and second overlying conductive lines (132 in FIG. 1B), may be carried out.

The memory structure and the method for manufacturing the same according to the embodiments provide additional pad layers (124) for the first connectors (126). The pad layers (124) may have a larger thickness and a higher conductivity than the channel layers (122). As such, better connections and lower resistances can be provided for, for example, the bit lines (130). In addition, in the method described above, a simpler and regular patterning process (FIGS. 13A-13B) is used. Thereby, the process actuary and other benefits may be provided. It can be understood that, while the forgoing embodiments are directed to the 3-D vertical channel NAND memory structures, the provided memory structure and the method for manufacturing the same can be applied to other types of memory structures while possible.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory structure, comprising:
   a substrate;
   a plurality of stacks disposed on the substrate, the stacks separated from each other by a plurality of first trenches, the stacks comprising alternately arranged first stacks and second stacks, wherein each of the stacks comprises alternately stacked conductive strips and insulating strips;
   a plurality of memory layers partially disposed in the first trenches, the memory layers extending onto the stacks in a conformal manner;
   a plurality of channel layers disposed on the memory layers in a conformal manner; and
   a plurality of pad layers at least disposed on the channel layers at portions of the channel layers that are horizontally extending above the first stacks;
   wherein the channel layers at two sides of one of the stacks are offset in an extending direction of the stacks by a distance.

2. The memory structure according to claim 1, wherein a thickness of the pad layers is larger than a thickness of the channel layers.

3. The memory structure according to claim 2, wherein the thickness of the pad layers is in a range between 50 Å and 1000 Å.

4. The memory structure according to claim 2, wherein the thickness of the channel layers is in a range between 30 Å and 300 Å.

5. The memory structure according to claim 1, further comprising:
   a plurality of first connectors substantially disposed above the first stacks, the first connectors contacting the pad layers; and
   a plurality of second connectors substantially disposed above the second stacks.

6. The memory structure according to claim 5, wherein the second connectors contact the memory layers.

7. The memory structure according to claim 5, further comprising:
   a plurality of first overlying conductive lines, wherein the first connectors couple the channel layers to the first overlying conductive lines by the pad layers; and
   a plurality of second overlying conductive lines, wherein the second connectors couple the channel layers to the second overlying conductive lines.

8. The memory structure according to claim 7, wherein the first overlying conductive lines extend in a direction different from an extending direction of the conductive strips of the stacks, and the second overlying conductive lines extend in the extending direction of the conductive strips of the stacks.

9. The memory structure according to claim 7, wherein the conductive strips of the stacks comprise word lines, the first overlying conductive lines are bit lines, and the second overlying conductive lines are common source lines.

10. The memory structure according to claim 1, wherein the plurality of pad layers further comprise pad layers disposed on the channel layers at positions substantially above the second stacks.

11. The memory structure according to claim 1, wherein the channel layers are separated from each other in a direction perpendicular to the extending direction of the stacks by a plurality of second trenches above the stacks.

12. The memory structure according to claim 1, wherein the channel layers are separated from each other in the extending direction of the stacks by a plurality of isolation structures, each of the isolation structures comprises a first portion and a second portion on the first portion, and a cross-sectional area of the second portion is larger than a cross-sectional area of the first portion.

13. The memory structure according to claim 1, wherein the each of the stacks further comprises an insulating layer disposed above the conductive strips and the insulating strips.

\* \* \* \* \*